(12) United States Patent
Bae et al.

(10) Patent No.: US 12,272,581 B2
(45) Date of Patent: Apr. 8, 2025

(54) STEERING DEVICES FOR OHT

(71) Applicant: Samsung Electronics Co., Ltd., Suwon-si (KR)

(72) Inventors: Sangjune Bae, Changwon-si (KR); Jimin Choi, Suwon-si (KR); Hyungsik Um, Suwon-si (KR); Jeongjae Bang, Suwon-si (KR); Hyeonhui Cho, Bucheon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 825 days.

(21) Appl. No.: 17/493,198

(22) Filed: Oct. 4, 2021

(65) Prior Publication Data

US 2022/0285189 A1    Sep. 8, 2022

(30) Foreign Application Priority Data

Mar. 8, 2021   (KR) .................. 10-2021-0030035

(51) Int. Cl.
| | |
|---|---|
| H01L 21/677 | (2006.01) |
| B61B 3/02 | (2006.01) |
| B61B 12/02 | (2006.01) |
| B65G 1/04 | (2006.01) |
| B66C 9/04 | (2006.01) |
| F16C 35/00 | (2006.01) |

(52) U.S. Cl.
CPC .......... *H01L 21/67706* (2013.01); *B61B 3/02* (2013.01); *B61B 12/02* (2013.01); *B65G 1/0457* (2013.01); *B66C 9/04* (2013.01); *F16C 35/00* (2013.01); *H01L 21/67733* (2013.01)

(58) Field of Classification Search
CPC ......... H01L 21/67733; H01L 21/67706; H01L 21/6773; H01L 21/67703; B61B 3/02; B61B 12/02; B65G 1/0457; B66C 9/04; F16C 35/00

See application file for complete search history.

(56) References Cited

U.S. PATENT DOCUMENTS

2002/0029719 A1\*  3/2002  Matsukawa ............. B61B 13/00
                                                                 104/165

FOREIGN PATENT DOCUMENTS

| JP | 2002-037059 A | | 2/2002 |
|---|---|---|---|
| JP | 2004314740 | \* | 11/2004 |
| JP | 4265266 B2 | | 5/2009 |
| JP | 6677187 B2 | | 4/2020 |
| JP | 2020-131985 A | | 8/2020 |
| KR | 10-1087236 B1 | | 11/2011 |
| KR | 20140118246 A | \* | 10/2014 |
| KR | 10-1530028 B1 | | 6/2015 |
| KR | 20180061542 A | \* | 6/2018 |

(Continued)

*Primary Examiner* — Zachary L Kuhfuss
*Assistant Examiner* — Cheng Lin
(74) *Attorney, Agent, or Firm* — FINNEGAN, HENDERSON, FARABOW, GARRETT & DUNNER LLP

(57) ABSTRACT

A steering device for an OHT according to some example embodiments of the present inventive concepts includes: an LM block; a steering plate fixedly installed to the LM block and provided with an insertion groove; a link installed in the insertion groove of the steering plate and tilted; a main bearing having an outer circumferential surface in contact with the link to reduce friction when the link is tilted; and a guide roller rotatably installed on a protrusion protruding from the link.

20 Claims, 12 Drawing Sheets

(56) References Cited

FOREIGN PATENT DOCUMENTS

| KR | 10-2019-0047905 | A | | 5/2019 |
|----|----|----|----|----|
| KR | 10-2019-0063951 | A | | 6/2019 |
| KR | 102046433 | B1 | * | 12/2019 |
| KR | 10-2020-0082011 | A | | 7/2020 |

* cited by examiner

STEERING DEVICES FOR OHT

CROSS-REFERENCE TO RELATED APPLICATIONS

This application claims benefit of priority, under 35 U.S.C. § 119, to Korean Patent Application No. 10-2021-0030035 on Mar. 8, 2021 in the Korean Intellectual Property Office, the disclosure of which is incorporated by reference herein in its entirety.

BACKGROUND

The present inventive concepts relate to steering devices for an overhead hoist transport (OHT).

An overhead hoist transport (OHT) is a transportation container transportation device for transporting transportation containers between facilities within a semiconductor line, that is transport products (FOSB, MAC, CST, or the like). However, when the OHT enters a guide rail, a rotational radius of the guide rail is different from a rotational radius of the guide roller provided in the steering device for an OHT, so uneven contact between the guide rail and the guide roller occurs. Accordingly, this may result in concentration of a load on the guide roller.

SUMMARY

Some example embodiments of the inventive concepts provide a steering device for an overhead hoist transport (OHT) configured to reduce or prevent damage to a guide rail and the steering device for an OHT, for example based on being configured to reduce or prevent the likelihood of impacts between the OHT steering device and the guide rail. A steering device according to any of some example embodiments may enable improved (e.g., increased) production in a semiconductor line due to reducing or preventing damage to the guide rail and/or the steering device. A steering device for an OHT according to any of some example embodiments may reduce or prevent the likelihood of a human accident based on reducing or preventing the likelihood of the OHT falling due to damage to the guide rail and the steering device for the OHT.

In addition, some example embodiments of the inventive concepts provide a steering device for an OHT that can reduce mechanical vibrations and impacts transmitted to a wafer while the OHT is running.

According to some example embodiments of the inventive concepts, a steering device for an OHT may include a linear motion (LM) block, a steering plate fixedly installed to the LM block and including one or more inner surfaces at least partially defining an insertion groove in the steering plate, a link tiltably installed in the insertion groove of the steering plate, a main bearing having an outer circumferential surface in contact with the link, the main bearing configured to reduce friction when the link is tilted in relation to the steering plate, and a guide roller rotatably installed on a protrusion protruding from the link.

According to some example embodiments of the inventive concepts, a steering device for an OHT may include a linear motion (LM) block, a steering plate fixedly installed on an upper surface of the LM block and including one or more inner surfaces at least partially defining an insertion groove in an upper surface of the steering plate, a link that is at least partially within the insertion groove and is configured to be tilted in response to an external force being applied to the link, a main bearing between the steering plate and the link, a guide roller rotatably installed on an installation protrusion protruding from the link, a cover configured to cover the main bearing and the insertion groove of the steering plate, and a fixing member extending through the steering plate, the fixing member configured to fix the main bearing in place.

According to some example embodiments of the inventive concepts, a steering device for an OHT may include a linear motion (LM) block, a steering plate fixedly installed to the LM block and including one or more inner surfaces at least partially defining an insertion groove in the steering plate, and a link tiltably installed in the insertion groove of the steering plate such that the link is configured to rotate in relation to the steering plate around a central axis of the link at least partially within the insertion groove. An interval between an outer side surface of the link and a side surface of the insertion groove may be between about 1 mm and about 3 mm.

BRIEF DESCRIPTION OF THE DRAWINGS

The above and other aspects, features, and advantages of the present inventive concepts will be more clearly understood from the following detailed description, taken in conjunction with the accompanying drawings, in which.

DETAILED DESCRIPTION

Figure 1:
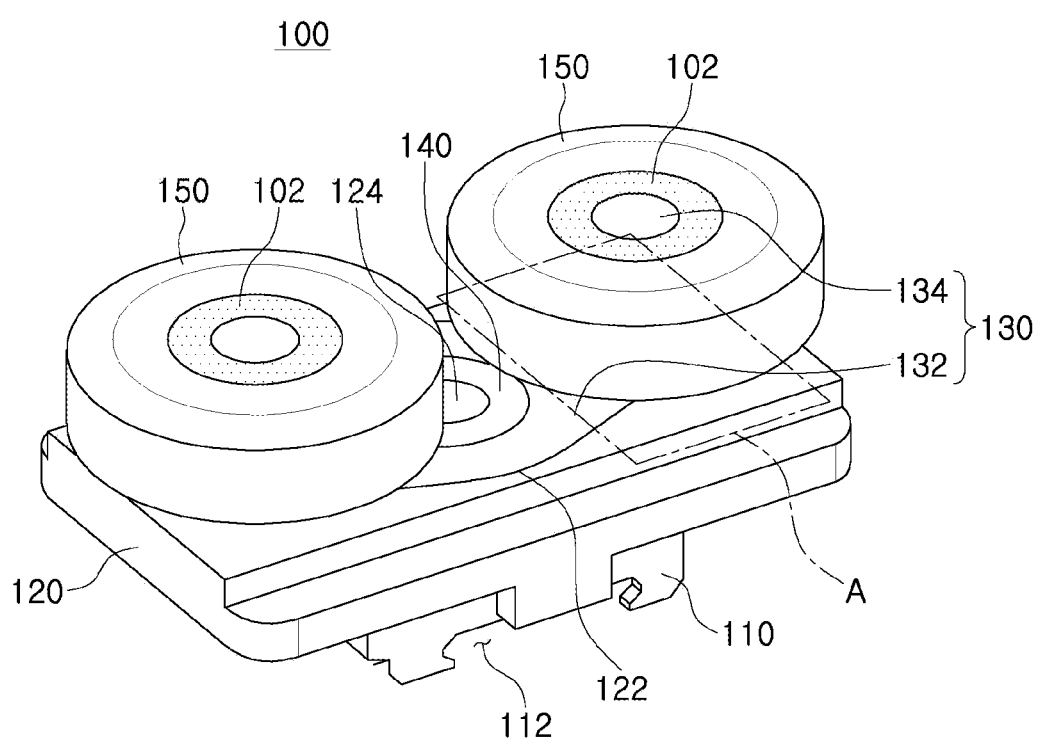
FIG. 1 is a perspective view illustrating a steering device for an overhead hoist transport (OHT) according to some example embodiments.

Hereinafter, some example embodiments of the present inventive concepts will be described with reference to the accompanying drawings.

It will be understood that when an element such as a layer, film, region, or substrate is referred to as being "on" another element, it may be directly on the other element or intervening elements may also be present. In contrast, when an element is referred to as being "directly on" another element, there are no intervening elements present. It will further be understood that when an element is referred to as being "on" another element, it may be above or beneath or adjacent (e.g., horizontally adjacent) to the other element.

It will be understood that elements and/or properties thereof (e.g., structures, surfaces, directions, or the like), which may be referred to as being "perpendicular," "parallel," "coplanar," or the like with regard to other elements and/or properties thereof (e.g., structures, surfaces, directions, or the like) may be "perpendicular," "parallel," "coplanar," or the like or may be "substantially perpendicular," "substantially parallel," "substantially coplanar," respectively, with regard to the other elements and/or properties thereof.

Elements and/or properties thereof (e.g., structures, surfaces, directions, or the like) that are "substantially perpendicular" with regard to other elements and/or properties thereof will be understood to be "perpendicular" with regard to the other elements and/or properties thereof within manufacturing tolerances and/or material tolerances and/or have a deviation in magnitude and/or angle from "perpendicular," or the like with regard to the other elements and/or properties thereof that is equal to or less than 10% (e.g., a. tolerance of ±10%).

Elements and/or properties thereof (e.g., structures, surfaces, directions, or the like) that are "substantially parallel" with regard to other elements and/or properties thereof will be understood to be "parallel" with regard to the other elements and/or properties thereof within manufacturing tolerances and/or material tolerances and/or have a deviation in magnitude and/or angle from "parallel," or the like with regard to the other elements and/or properties thereof that is equal to or less than 10% (e.g., a. tolerance of ±10%).

Elements and/or properties thereof (e.g., structures, surfaces, directions, or the like) that are "substantially copla-nar" with regard to other elements and/or properties thereof will be understood to be "coplanar" with regard to the other elements and/or properties thereof within manufacturing tolerances and/or material tolerances and/or have a deviation in magnitude and/or angle from "coplanar," or the like with regard to the other elements and/or properties thereof that is equal to or less than 10% (e.g., a. tolerance of ±10%)).

It will be understood that elements and/or properties thereof may be recited herein as being "the same" or "equal" as other elements, and it will be further understood that elements and/or properties thereof recited herein as being "identical" to, "the same" as, or "equal" to other elements may be "identical" to, "the same" as, or "equal" to or "substantially identical" to, "substantially the same" as or "substantially equal" to the other elements and/or properties thereof. Elements and/or properties thereof that are "substantially identical" to, "substantially the same" as or "substantially equal" to other elements and/or properties thereof will be understood to include elements and/or properties thereof that are identical to, the same as, or equal to the other elements and/or properties thereof within manufacturing tolerances and/or material tolerances. Elements and/or properties thereof that are identical or substantially identical to and/or the same or substantially the same as other elements and/or properties thereof may be structurally the same or substantially the same, functionally the same or substantially the same, and/or compositionally the same or substantially the same.

It will be understood that elements and/or properties thereof described herein as being "substantially" the same and/or identical encompasses elements and/or properties thereof that have a relative difference in magnitude that is equal to or less than 10%. Further, regardless of whether elements and/or properties thereof are modified as "substantially," it will be understood that these elements and/or properties thereof should be construed as including a manufacturing or operational tolerance (e.g., ±10%) around the stated elements and/or properties thereof.

When the terms "about" or "substantially" are used in this specification in connection with a numerical value, it is intended that the associated numerical value include a tolerance of ±10% around the stated numerical value. When ranges are specified, the range includes all values therebetween such as increments of 0.1%.

Figure 2:
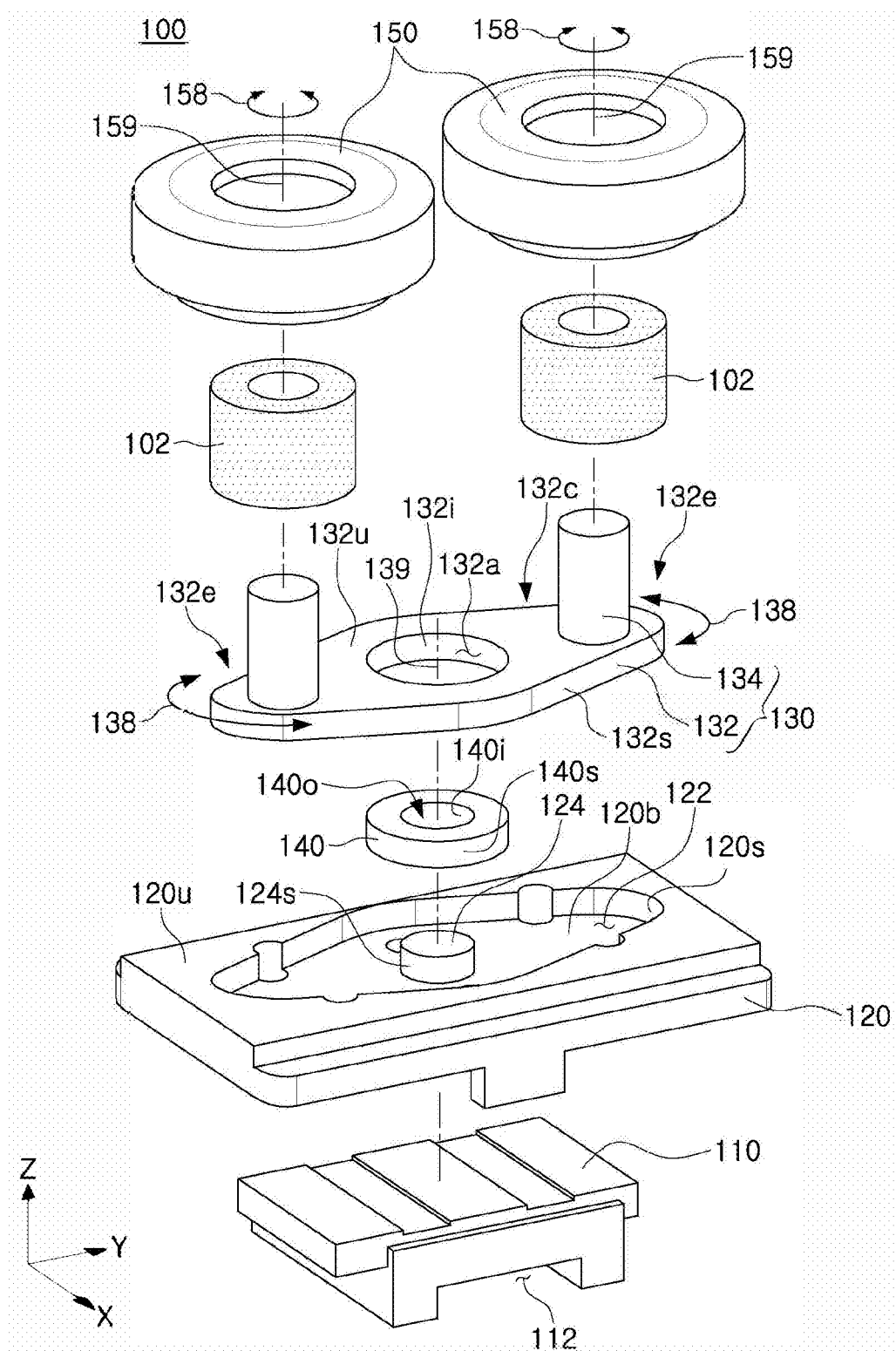
FIG. 2 is an exploded perspective view illustrating a steering device for an OHT according to some example embodiments.
Figure 3:
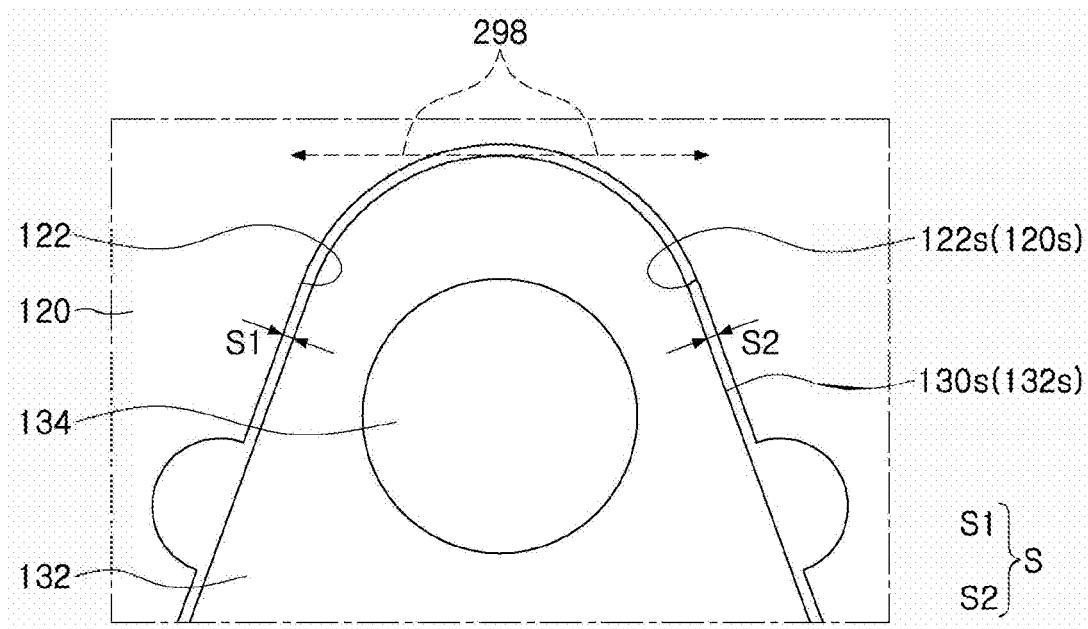
FIG. 3 is an enlarged view illustrating a portion A of FIG. 1.

FIG. 1 is a perspective view illustrating a steering device for an OHT according to some example embodiments, FIG. 2 is an exploded perspective view illustrating a steering device for an OHT according to some example embodiments, and FIG. 3 is an enlarged view illustrating part A of FIG. 1.

Referring to FIGS. 1 to 3, a steering device 100 for OHT according to some example embodiments, as an example, may include an LM ("Linear Motion") block 110, a steering plate 120, a link 130, a main bearing 140, and a guide roller 150.

The LM block 110 is configured to be movably installed on a guide rail (not shown) on an upper portion of the OHT steering device 100 for steering of the OHT steering device 100 and is configured to move along an LM guide rail (not shown). To this end, the LM block 110 may be provided with an installation groove 112 into which the LM guide rail (not shown) is inserted.

The steering plate 120 is installed on (e.g., fixedly installed to) the LM block 110 to be disposed above the LM block 110. As an example, the steering plate 120 may have a substantially plate shape. Meanwhile, an insertion groove 122 into which a lower end portion of the main bearing 140 and the link 130 is inserted may be provided on an upper surface 120*u* of the steering plate 120. Restated, the steering plate 120 may include one or more inner surfaces 120*s* and 120*b* that collectively at least partially define an insertion groove 122 into the upper surface 120*u* the steering plate 120. Restated, the steering plate 120 may include an insertion groove 122. As an example, the insertion groove 122 may have a shape corresponding to the shape of the link 130. In addition, the steering plate 120 may be provided with an installation protrusion 124 disposed in the insertion groove 122 and on which the main bearing 140 is installed. As an example, the installation protrusion 124 may be disposed in a central portion of the insertion groove 122.

The link 130 is tiltably installed on the steering plate 120 (e.g., is tiltably installed in the insertion groove 122 of the steering plate 120). As an example, the link 130 may include a plate-shaped body 132 insertedly disposed into the insertion groove 122 (e.g., located at least partially within the insertion groove 122 as shown in at least FIGS. 1 and 3) and protrusions 134 protruding from both (e.g., opposite) end portions 132*e* of an upper surface 132*u* of the body 132. Restated, the link 130 may include protrusions 134 protruding from separate, respective (e.g., opposite) end portions 132*e* of the upper surface 132*u* of the body 132. Meanwhile, a through-hole 132*a* into which the main bearing 140 is inserted may be provided in a central portion of the body 132. Restated, the body 132 may include one or more inner surfaces 132*i* defining the through-hole 132*a* in the central portion 132*c* of the body 132 and which extends through the plate-shaped body 132 and which is configured to receive the main bearing 140, and/or where the main bearing 140 is configured to be inserted into the through-hole 132*a*, so that the main bearing is in contact with the link 130 (e.g., the outer circumferential surface 140*s* of the main bearing 140 is in flush contact with the one or more inner surfaces 132*i*). As shown, the central axis of the through hole 132*a* may be coaxial with the central axis 139 of the link 130. In addition, the body 132 of the link 130 has a shape corresponding to the shape of the insertion groove 122, and may have a size, smaller than a size of the insertion groove 122. As an example, as shown in FIG. 3, an interval S (e.g., gap) between an outer side surface 130*s* of the link 130, that is, an outer surface 132*s* of the body 132 and an inner side surface 122*s* of the insertion groove 122 (e.g., defined by an inner side surface 120*s* of the steering plate 120) may be 1 to 3 mm. Accordingly, when an impact is applied to the guide roller 150, the link 130 may be tilted around an installation protrusion 124 in the insertion groove 122 within the interval S (e.g., the tilting may include rotation 138 around the central axis 139 of the link 130 within the insertion groove 122 (where the central axis 139 may be coaxial with a central axis of the main bearing 140 and installation protrusion 124 and/or may extend perpendicular to the upper surface 120*u* of the steering plate 120 and/or may extend perpendicular to the upper surface 132*u* of the plate-shaped body 132) within the insertion groove 122, where the tilting may include the rotation 138 of the link 130 to move in an arc within the clearance provided by the interval S between positions at which the outer surface 132*s* of the body 132 may contact different parts of one or more inner side surfaces 120*s* of the steering plate 120 that define one or more inner side surfaces 122*s* of the insertion groove 122). Accordingly, it will be understood that the link 130 being tiltably installed in the insertion groove 122 refers to the link 130, being at least partially within the insertion groove 122, being configured to be tilted so as to rotate 138 in an arc in relation to the steering plate 120 around the central axis 139, for example to rotate 138 in response to an external force being applied to the link 130 (e.g., via protrusions 134).

As an example, the link 130 may include multiple protrusions 134 (e.g., two protrusions 134) that protrude from opposite end portions 132*e* of the upper surface 132*u* of the body 132. However, the present inventive concepts are not limited thereto, and the number of guide rollers 150 may be changed.

Meanwhile, when an interval S between the outer surface of the body 132 and the inner surface of the insertion groove 122 exceeds about 3 mm, in a curved portion of the guide rail (not shown), an overhead hoist transport (OHT) may come off and fall. Accordingly, the interval S between the outer surface of the body 132 and the inner surface of the insertion groove 122 should be about 3 mm or less.

Furthermore, when the interval S between the outer surface of the body 132 and the inner surface of the insertion groove 122 is less than about 1 mm, the impact transmitted to the guide roller 150 may not be dispersed. Accordingly, the interval S between the outer surface of the body 132 (e.g., outer surface 132*s*) and the inner surface of the insertion groove 122 (e.g., inner side surface 122*s*) should be about 1 mm or more.

Accordingly, the interval S between the outer surface of the body 132 (e.g., outer surface 132*s*) and the inner surface of the insertion groove 122 (e.g., inner side surface 122*s*) should be between about 1 mm and about 3 mm.

The interval S as described herein (and the magnitude thereof) may refer to a spacing between the outer side surfaces 130*s* of the link 130 and the inner side surfaces 122*s*/120*s* when the link 130 is not tilted in relation to the steering plate 120 such that the spacings S1 and S2 of opposite outer side surfaces 130*s* of the link 130 from respective opposing inner side surfaces 122*s* of the insertion groove 122 are equal or substantially equal (e.g., the interval S refers to the magnitude of spacings S1 and/or S2 when the magnitude of spacing S1 equals or substantially equals the magnitude of spacing S2).

The main bearing 140 is in contact with the link 130. As shown in at least FIGS. 1-2, the main bearing may be located between the steering plate 120 and the link 130. The main bearing 140 may couple the link 130 to the steering plate 120. The main bearing 140 may be configured to (e.g., serve to) reduce friction when the link 130 is tilted in relation to the steering plate 120 (e.g., the link 130 is rotated 138 around the central axis 139 in relation to the steering plate 120). As an example, the main bearing 140 may have a circular annular shape. As shown, the main bearing 140 may have an outer circumferential surface 140*s* that may be in contact with the link 130 (e.g., in flush contact with the inner surface 132*i* of the link body 132 as shown in at least FIG. 1). Meanwhile, the main bearing 140 is coupled to an installation protrusion 124 of the steering plate 120 and is disposed in a through-hole 132*a* of the link 130. Accordingly, as shown in at least FIG. 2, the steering plate 120 may include an installation protrusion 124 that is located in the insertion groove 122 (e.g., protrudes from bottom surface 120*b* into the insertion groove 122) and on which the main bearing 140 is installed. For example, the installation protrusion 124 may extend or protrude into a central opening 140*o* defined by an inner surface 140*i* of the main bearing 140 so that an outer circumferential surface 124*s* of the installation protrusion 124 contacts (e.g., is in flush contact with) the inner surface 140*i* of the main bearing 140.

The guide roller 150 is rotatably installed on the link 130 (e.g., on a protrusion 134 protruding from the link 130). As an example, the guide roller 150 may be installed (e.g., rotatably installed) on (e.g., coupled to) a protrusion 134 of the link 130 (where the protrusion 134 may be referred to herein as a protrusion protruding from the link 130) via (e.g., through a bearing 102 such that the guide roller 150 is rotatably installed on the protrusion 134. Accordingly, the guide roller 150 may be tilted in conjunction with the link 130 (e.g., the tilting may include rotation 158 around the central axis 159 of the guide roller 150 (where the central axis 159 may be coaxial with a central axis of the bearing 102 and protrusion 134). That is, when external force acts, external force applied to the guide roller 150 is transmitted to the link 130 so that the link 130 is tilted. In this case, a body 132 of the link 130 may be tilted within the insertion groove 122 to alleviate impacts caused by external force.

In addition, some example embodiments of the inventive concepts provide a steering device for an OHT that can reduce mechanical vibrations and impacts transmitted to a wafer while the OHT is running.

In some example embodiments, the bearing 102 may be absent and the guide roller 150 may installed on the protrusion 134 to be directly contacting the protrusion 134.

As an example, the guide roller 150 may be installed on the link 130 such that the two thereof form a pair. However, the present inventive concepts are not limited thereto, and the number of guide rollers 150 may be changed.

As described above, since the link 130 is tiltably installed in the insertion groove 122 of the steering plate 120 so as to be configured to tilt (e.g., rotate 138 in relation to the steering plate 120 around central axis 139) at least partially within the insertion groove 122 (e.g., rotate 138 within the interval S, e.g., about 1 mm to about 3 mm), it is possible to reduce or prevent damage to the steering device 100 for the OHT based on the steering device 100 including the link 130 that is tiltably installed in the steering plate 120. In other words, even when external force is applied to the guide roller 150 due to the collision between a guide rail (not shown) and the guide roller 150, the link 130 is tilted (e.g., rotated 138 around central axis 139, for example rotated 138 within interval S which may be between about 1 mm and about 3 mm) to alleviate impacts. Accordingly, it is possible to reduce or prevent damage to the guide rail and the steering device 100 for the OHT based on the steering device 100 including the link 130 that is tiltably installed in the steering plate 120.

Furthermore, since the link 130 is tiltably installed in the insertion groove 122 of the steering plate 120, mechanical vibrations and impacts transmitted to the wafer while the OHT is running can be reduced based on the steering device 100 including the link 130 that is tiltably installed in the steering plate 120.

In some example embodiments, the steering device according to any of the example embodiments may omit at least some of the elements of the steering device described according to some example embodiments. For example, referring to FIGS. 1-3, in some example embodiments the steering device 100 may omit at least one of the main bearing 140, one or more or all of the guide rollers 150, the installation protrusion 124, one or more or all of the protrusions 134, or the like. For example, in some example embodiments, the steering device 100 may include the LM block 110, the steering plate 120 fixedly installed to the LM block 110 and including one or more inner surfaces 120s, 120b at least partially defining an insertion groove 122 in the steering plate 120, and a link 130 tiltably installed in the insertion groove of the steering plate such that the link is configured to rotate 138 in relation to the steering plate 120 around a central axis 139 of the link 130 at least partially within the insertion groove 122, wherein an interval S between an outer side surface 130s of the link 130 (e.g., outer surface 132s) and an inner side surface 122s of the insertion groove 122 (e.g., inner surface 120s) is between about 1 mm and about 3 mm (e.g., when the link 130 is in a non-tilted state such that S1 is equal or substantially equal to S2).

Figure 4:
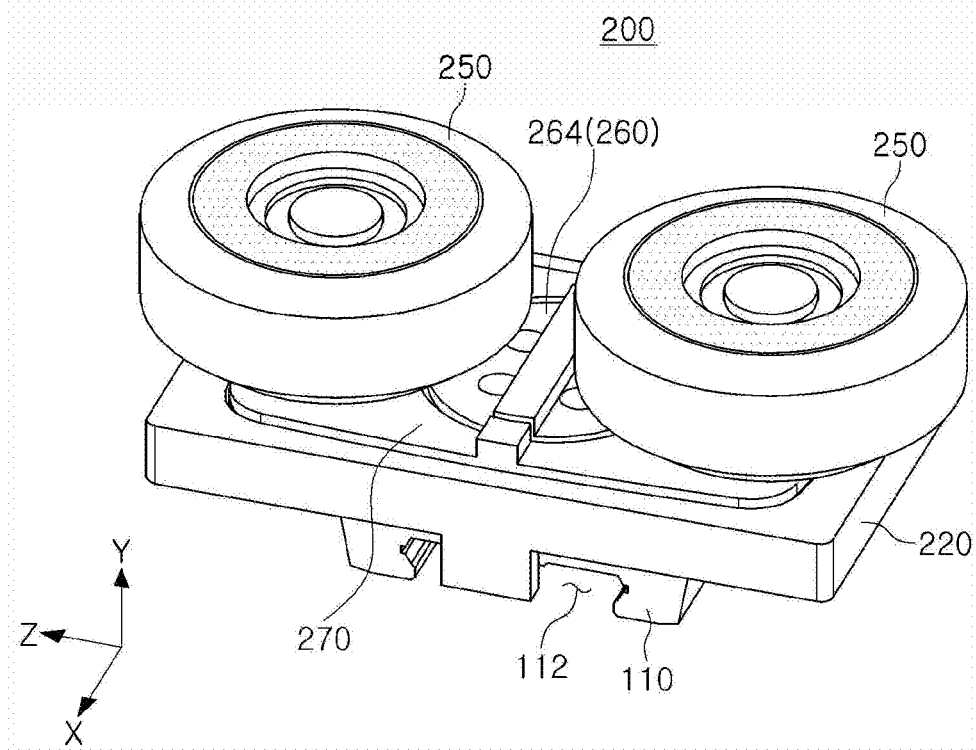
FIG. 4 is a perspective view illustrating a steering device for an OHT according to some example embodiments.
Figure 5:
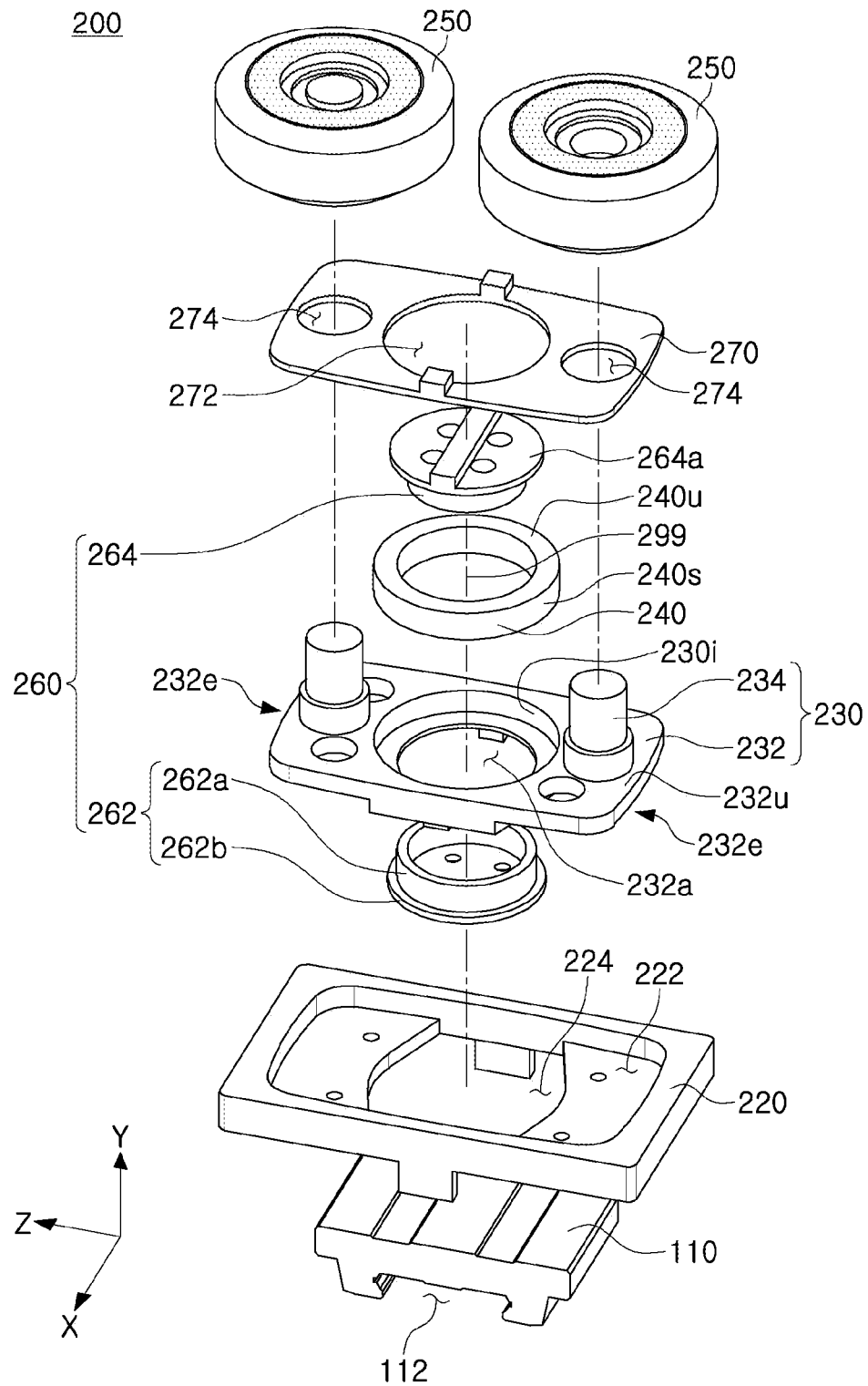
FIG. 5 is an exploded perspective view illustrating a steering device for an OHT according to some example embodiments.

FIG. 4 is a perspective view illustrating a steering device for an OHT according to some example embodiments, and FIG. 5 is an exploded perspective view illustrating a steering device for an OHT according to some example embodiments.

Referring to FIGS. 4 and 5, a steering device 200 for an OHT may include, as an example, an LM block 110, a steering plate 220, link 230, a main bearing 240, a guide roller 250, a fixing member 260, and a cover 270.

Meanwhile, since the LM block 110 is substantially the same as the above-described components, a detailed description thereof will be omitted here and will be replaced with the above description.

The steering plate 220 is installed on the LM block 110 so as to be disposed on the LM block 110. As an example, the steering plate 220 may have a substantially plate shape. Meanwhile, an insertion groove 222 into which a lower end portion of the link 230 is inserted is formed in the steering plate 220, and an installation hole 224 in which the fixing member 260 is installed may be provided in a central portion the insertion groove 222. As an example, the insertion groove 222 may have a shape corresponding to the shape of the lower end portion of the link 230. In addition, the installation hole 224 may have a size through which a fixing member 260 can be installed.

The link 230 is tiltably installed on the steering plate 220 (e.g., installed on the steering plate 220 and configured to tilt, or rotate around central axis 299 at least partially within the insertion groove 222). As an example, the link 230 may include a plate-shaped body 232 insertedly disposed in the insertion groove 222 (e.g., at least partially located within the insertion groove 222), and protrusions 234 disposed to protrude from both end portions (e.g., opposite end portions 232e) of the upper surface 232u of the body 232. Restated, the link 230 may include protrusions 234 protruding from separate, respective (e.g., opposite) end portions 232e of the upper surface 232u of the body 232. Meanwhile, a through-hole 232a into which the main bearing 240 is inserted may be provided in a central portion of the body 232. In addition, the body 232 of the link 230 has a shape corresponding to the shape of the insertion groove 222, and may have a substantially rectangular plate shape as an example. Meanwhile, the body 232 of the link 230 may have a size, smaller than a size of the insertion groove 222. As an example, an interval between the outer surface of the body 232 and the inner surface of the insertion groove 222 may be about 1 mm to about 3 mm. Accordingly, when an impact (e.g., external force) is applied to the guide roller 250, the link 230 may be tilted within the insertion groove 222 in relation to the steering plate 220, for example tilted within the interval (e.g., about 1 mm to about 3 mm). As an example, the through-hole 232a of the link 230 may be formed to be stepped.

The main bearing 240 serves to reduce friction when the link 230 is tilted (e.g., rotated around central axis 299). As an example, the main bearing 240 may have a circular annular shape. Meanwhile, the main bearing 240 is fixed (e.g., fixed in place so as to not move in the Y direction) by the fixing member 260 and is disposed in the through-hole 232a of the link 230. For example, the fixing member 260 may be configured to fix the main bearing 240 in place (e.g., hold the main bearing 240 in place in relation to the link 230, the steering plate 220, etc.) such that the main bearing is prevented from moving (e.g., translating) in the Y direction, X direction, and/or Z direction by the fixing member 260 while the main bearing 240 is still configured to rotate around a central axis 299. The outer surface 240s of the main bearing 240 is disposed to be in contact (e.g., flush contact) with the inner surface 132i of the link 230. It will be understood that the main bearing 240 may be located between the steering plate 220 and the link 230.

The guide roller 250 is rotatably installed on the link 230. As an example, the guide roller 250 is installed on the protrusion 234 of the link 230 via a bearing (not shown). Accordingly, the guide roller 250 may be tilted in conjunction with the link 230. That is, when external force acts, external force applied to the guide roller 250 is transmitted to the link 230 so that the link 230 is tilted. In this case, the body 232 of the link 230 may be tilted within the insertion groove 222 to alleviate impacts caused by external force.

As an example, the guide roller 250 may be installed on the link 230 such that two of thereof form a pair. However, the present inventive concepts are not limited thereto, and the number of guide rollers 250 may be changed.

The fixing member 260 serves to fix the main bearing 240, and is insertedly disposed in the through-hole 232a of the link 230. As an example, the fixing member 260 may be provided with (e.g., may include) a first fixing member 262 disposed below the main bearing 240 and configured to be coupled to a lower portion of the main bearing 240, and a second fixing member 264 coupled to the first fixing member 262 above the first fixing member 262 and configured to prevent separation of the main bearing 240 from the link 230. As an example, an inner surface of the main bearing 240 is disposed to be in contact with an outer surface of a cylindrical portion 262a of the first fixing member 262, and a bottom surface of the main bearing 240 is disposed to be in contact with an upper portion of a disk portion 262b of the first fixing member 262. Meanwhile, the second fixing member 264 may include a protruding jaw 264a configured to support (e.g., contact and/or apply a force in the Y direction, X direction, and/or Z direction to) the upper surface 240u of the main bearing 240.

The cover 270 is disposed (e.g., configured) to cover (e.g., obscure and/or directly contact in the Y direction) an upper portion (e.g., upper surface 232u) of the link 230. As an example, the cover 270 may have a rectangular plate shape corresponding to the shape of the link 230. In addition, the cover 270 may include a first hole 272 through which the second fixing member 264 passes, and a second hole 274 through which the protrusion 234 of the link 230 passes. Meanwhile, the cover 270 is disposed (e.g., configured) to cover the main bearing 240 together with the link 230. As shown in FIG. 4, the cover 270 may cover (e.g., obscure and/or directly contact in the Y direction) the main bearing 240 and the insertion groove 222 of the steering plate 220. As described above, since the cover 270 is installed, it is possible to prevent foreign substances generated when the link 230 is tilted from leaking externally.

As described above, since the link 230 is installed to be tiltable within the insertion groove 222 of the steering plate 220 so as to be configured to tilt (e.g., rotate in relation to the steering plate 220 around central axis 299) at least partially within the insertion groove 222 (e.g., rotate within an interval of about 1 mm to about 3 mm), it is possible to reduce or prevent damage to the steering device 200 for OHT based on the steering device 200 including the link 230 that is tiltably installed in the steering plate 220. In other words, even when external force is applied to the guide roller 250 due to the collision between a guide rail (not shown) and the steering device 200 for OHT, the link 230 may be tilted to alleviate the impact. Accordingly, it is possible to reduce or prevent damage to the guide rail and the steering device 200 for the OHT based on the steering device 200 including the link 230 that is tiltably installed in the steering plate 220.

Furthermore, since the link 230 is attached to be tiltable within the insertion groove 222 of the steering plate 220, mechanical vibrations and impacts transmitted to a wafer while the OHT is running can be reduced based on the steering device 200 including the link 230 that is tiltably installed in the steering plate 220.

In addition, it is possible to prevent foreign substances generated when the link 230 is tilted through the cover 270 from leaking externally.

Hereinafter, with reference to the drawings, an effect of the steering device for an OHT will be described through experimental data of the steering device for an OHT that includes a tiltably installed link and a steering device that does not include a tiltably installed link according to some example embodiments.

Figure 6:
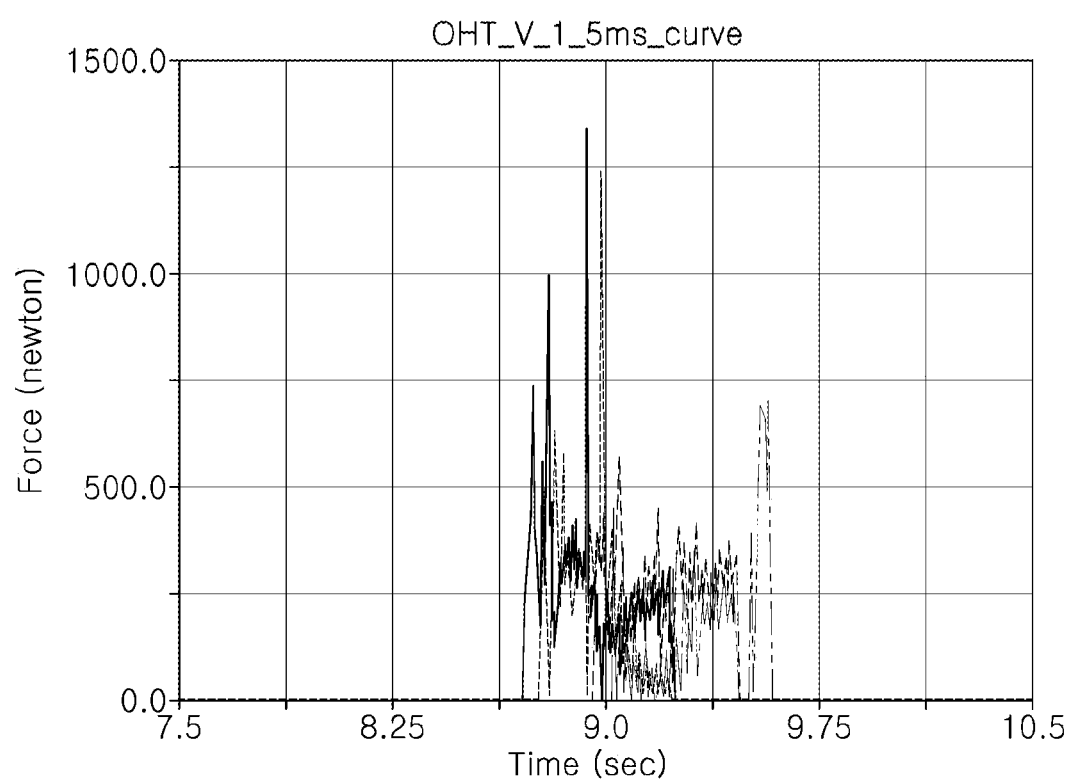
FIG. 6 is a graph illustrating impact force on a steering device and/or OHT when the steering device for the OHT is entering a curved portion of a guide rail (v=1,500 mm/s) according to some example embodiments.
Figure 7:
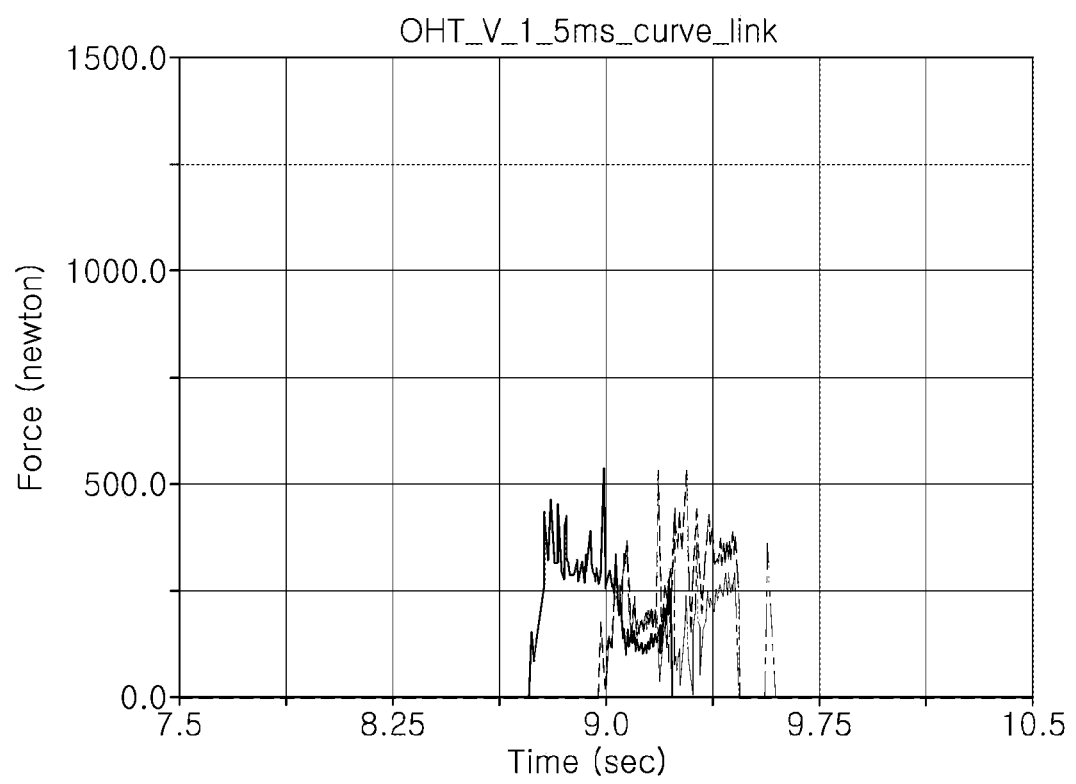
FIG. 7 is a graph illustrating impact force on a steering device and/or OHT when the steering device for the OHT is entering a curved portion of a guide rail (v=1,500 mm/s) according to some example embodiments.
Figure 8:
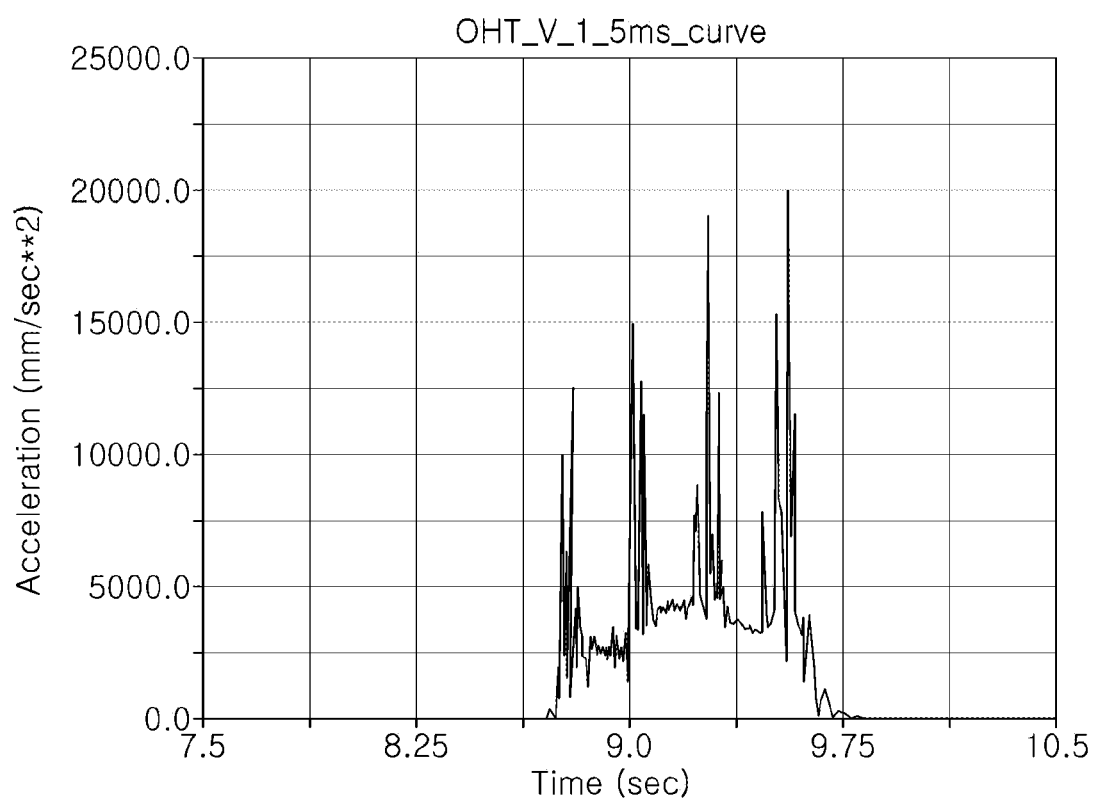
FIG. 8 is a graph illustrating an amount of vibrations of a steering device and/or OHT at the time of the steering device for the OHT entering the curved portion of a guide rail (v=1,500 mm/s) according to some example embodiments.
Figure 9:
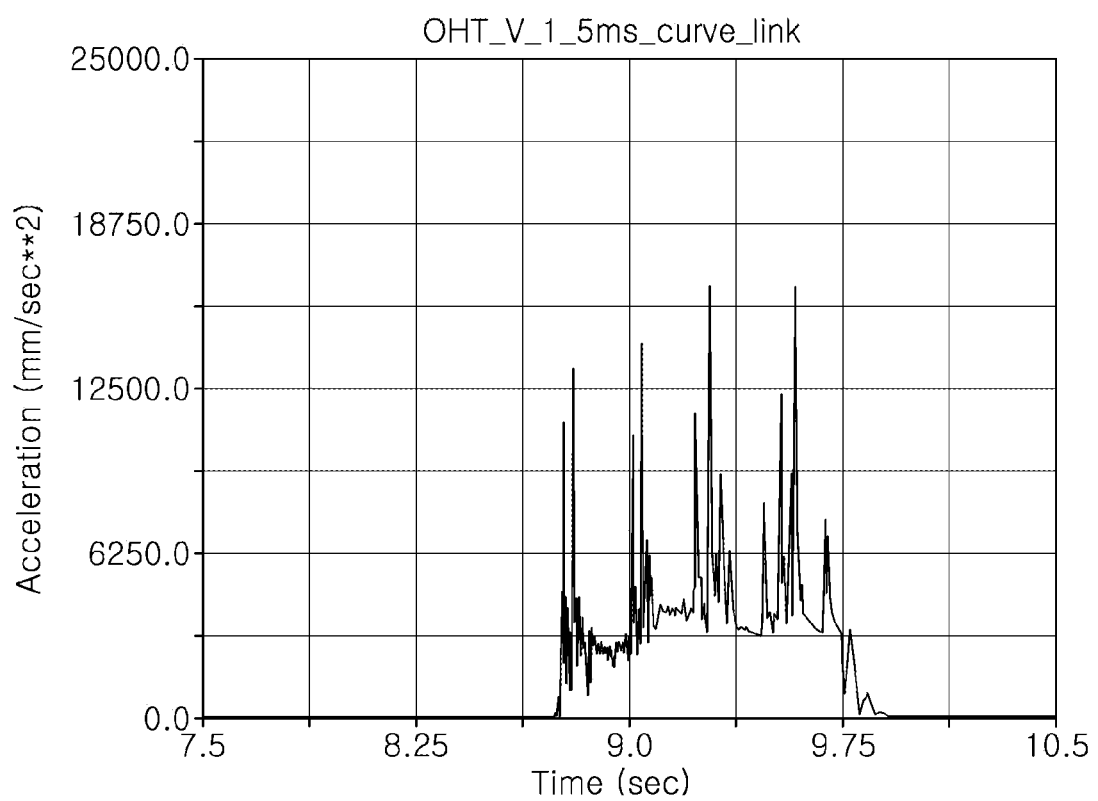
FIG. 9 is a graph illustrating an amount of vibrations of a steering device and/or OHT at the time of the steering device for the OHT entering the curved portion of a guide rail (v=1,500 mm/s) according to some example embodiments.

FIG. 6 is a graph illustrating impact force on a steering device and/or OHT coupled to the steering device when the steering device for the OHT is entering a curved portion of a guide rail (v=1,500 mm/s) according to some example embodiments wherein the steering device does not include a link that is tiltably installed on a steering plate of the steering device (e.g., may omit a link entirely or may include a link that is installed on a steering plate and is configured to not tilt, or rotate around a central axis of the link, in relation to the steering plate), FIG. 7 is a graph illustrating impact force on a steering device and/or OHT coupled to the steering device when the steering device for the OHT is entering a curved portion of a guide rail (v=1,500 mm/s) according to some example embodiments wherein the steering device includes a link that is tiltably installed on a steering plate of the steering device, FIG. 8 is a graph illustrating an amount of vibrations of a steering device and/or OHT coupled to the steering device at the time of the steering device for the OHT entering the curved portion of a guide rail (v=1,500 mm/s) according to some example embodiments wherein the steering device does not include a link that is tiltably installed on a steering plate of the steering device, and FIG. 9 is a graph illustrating an amount of vibrations of a steering device and/or OHT coupled to the steering device at the time of the steering device for the OHT entering the curved portion of a guide rail (v=1,500 mm/s) according to some example embodiments wherein the steering device includes a link that is tiltably installed on a steering plate of the steering device.

As shown in FIGS. 6 and 7, it can be seen that the impact force on a steering device and/or OHT coupled to the steering device when the steering device for the OHT is entering a curved portion of a guide rail (v=1,500 mm/s) according to some example embodiments wherein the steering device includes a link that is tiltably installed on a steering plate of the steering device is reduced by 58% compared to a steering device that does not include a link that is tiltably installed on a steering plate of the steering device. That is, it can be seen that, in a steering device that does not include a link that is tiltably installed on a steering plate of the steering device, when an entry speed of the steering device to the curved portion of a guide rail is 1500 mm/s, the impact force transmitted to the steering device and/or OHT may be 1340 N, but in the steering device for an OHT according to some example embodiments wherein the steering device includes a link that is tiltably installed on a steering plate of the steering device, when the entry speed of the steering device to the curved portion of the guide rails is 1500 mm/s, the impact force transmitted to the steering device and/or OHT may be 553 N.

In addition, as shown in FIGS. 8 and 9, it can be seen that the amount of vibrations of a steering device and/or OHT coupled to the steering device at the time of the steering device for the OHT entering the curved portion of a guide rail (v=1,500 mm/s) according to some example embodiments wherein the steering device includes a link that is tiltably installed on a steering plate of the steering device is reduced by 18% compared to a steering device that does not include a link that is tiltably installed on a steering plate of the steering device. That is, it can be seen that, in a steering device that does not include a link that is tiltably installed on a steering plate of the steering device, when the entry speed of the steering device to the curved portion of the guide rail is 1500 mm/s, the amount of vibrations transmitted to the steering device and/or OHT may be 2.04 g, but in the steering device for an OHT according to some example embodiments wherein the steering device includes a link that is tiltably installed on a steering plate of the steering device, when the entry speed of the steering device to the curved portion of the guide rail is 1500 mm/s, the amount of vibrations transmitted to the steering device and/or OHT may be 1.67 g.

As described above, it is possible to reduce the impact force transmitted to and the amount of vibrations of the steering device and/or OHT when the steering device for the OHT is in the curved portion of the guide rail according to some example embodiments wherein the steering device includes a link that is tiltably installed on a steering plate of the steering device.

Figure 10:
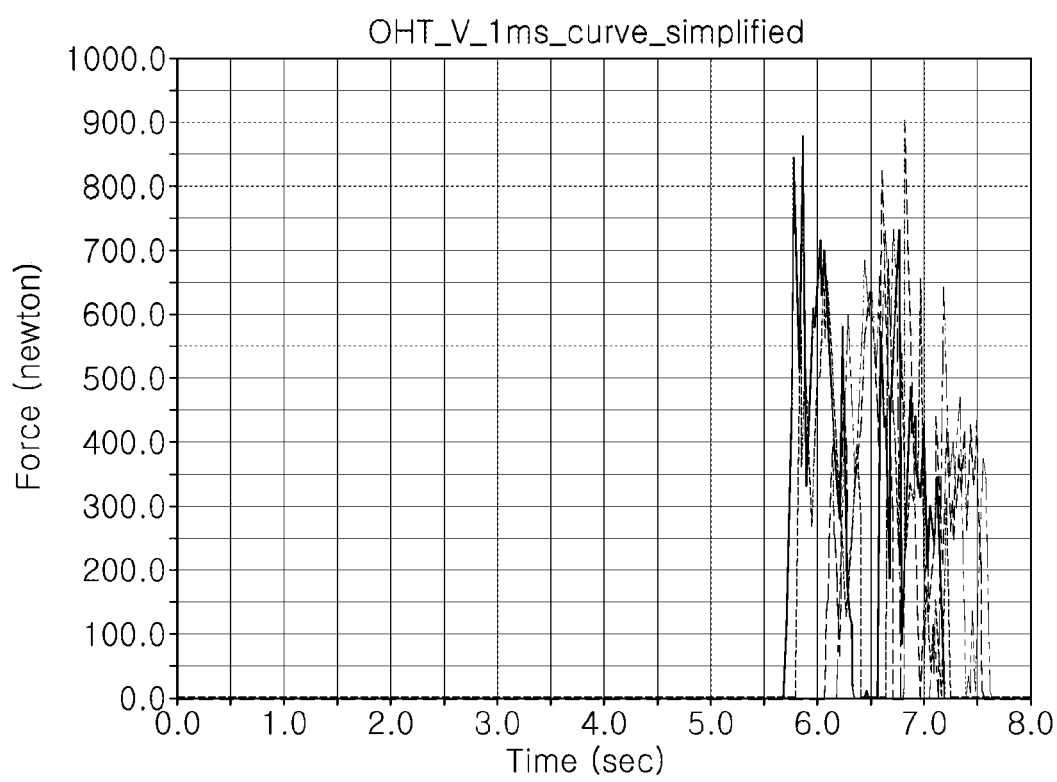
FIG. 10 is a graph illustrating impact force on a steering device and/or OHT coupled to the steering device at the time of the steering device for the OHT entering a guide rail N-branch (v=1,000 mm/s) according to some example embodiments.
Figure 11:
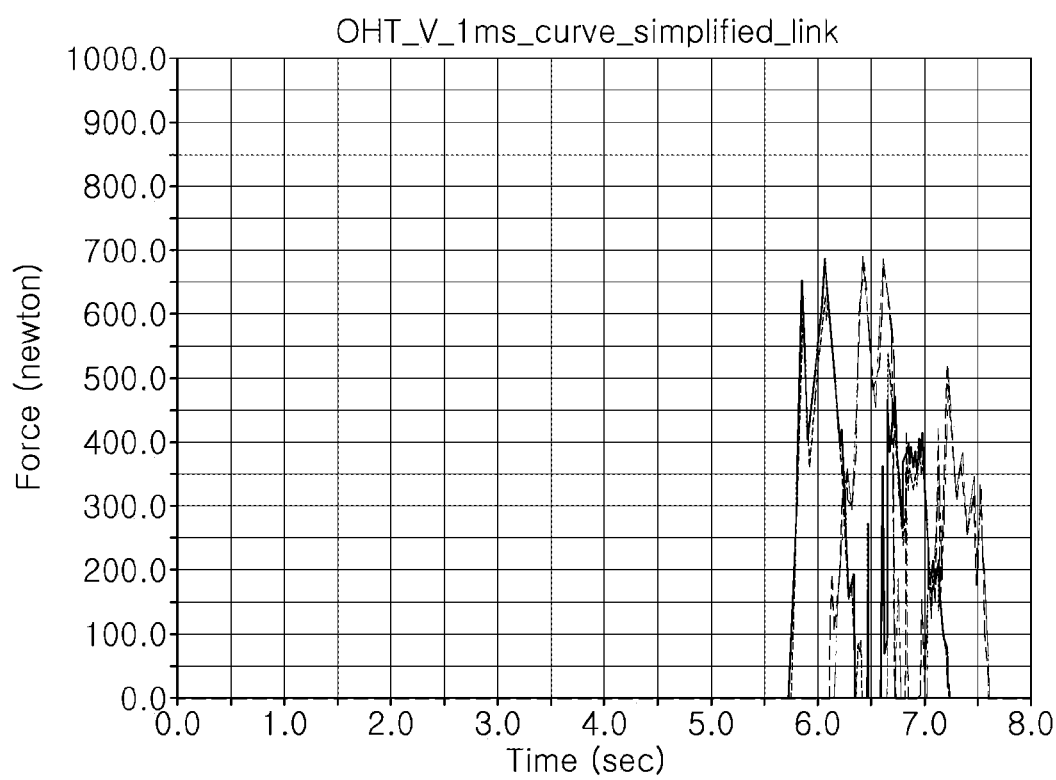
FIG. 11 is a graph illustrating impact force on a steering device and/or OHT coupled to the steering device at the time of the steering device for the OHT entering a guide rail N-branch (v=1,000 mm/s) according to some example embodiments.

FIG. 10 is a graph illustrating impact force on a steering device and/or OHT coupled to the steering device at the time of the steering device for the OHT entering a guide rail N-branch (v=1,000 mm/s) according to some example embodiments wherein the steering device does not include a link that is tiltably installed on a steering plate of the steering device (e.g., may omit a link entirely or may include a link that is installed on a steering plate and is configured to not tilt, or rotate around a central axis of the link, in relation to the steering plate), and FIG. 11 is a graph illustrating impact force on a steering device and/or OHT coupled to the steering device at the time of the steering device for the OHT entering a guide rail N-branch (v=1,000 mm/s) according to some example embodiments wherein the steering device includes a link that is tiltably installed on a steering plate of the steering device.

Here, looking at an N-branch region (e.g., guide rail N-branch), the N-branch region means a region in which a pair of guide rails are disposed in parallel and a pair of guide rails are connected from one guide rail to the other guide rail, that is, a region branched from one guide rail to the remaining guide rails. An N-branch region entry speed means a speed at which the steering device enters the branched guide rail in a region in which the guide rail is branched.

As shown in FIGS. 10 and 11, it can be seen that the impact force transmitted to the steering device and/or OHT coupled to the steering device at the time of the steering device for the OHT entering a guide rail N-branch (e.g., N-branch region) (v=1,000 mm/s) according to some example embodiments wherein the steering device includes a link that is tiltably installed on a steering plate of the steering device is reduced by 23% compared to a steering device that does not include a link that is tiltably installed on a steering plate of the steering device. That is, in a steering device that does not include a link that is tiltably installed on a steering plate of the steering device, when the N-branch region entry speed is 1000 mm/s, the impact force transmitted to the steering device and/or OHT may be 3902 N, but in the steering device for an OHT according to some example embodiments wherein the steering device includes a link that is tiltably installed on a steering plate of the steering device, when the N-branch entry speed is 1000 mm/s, it can be seen that the impact force transmitted to the steering device and/or OHT may be 693 N.

As described above, it is possible to reduce the impact force transmitted to the steering device and/or OHT in the N-branch region of the guide rail by the steering device for an OHT according to some example embodiments wherein the steering device includes a link that is tiltably installed on a steering plate of the steering device.

Figure 12:
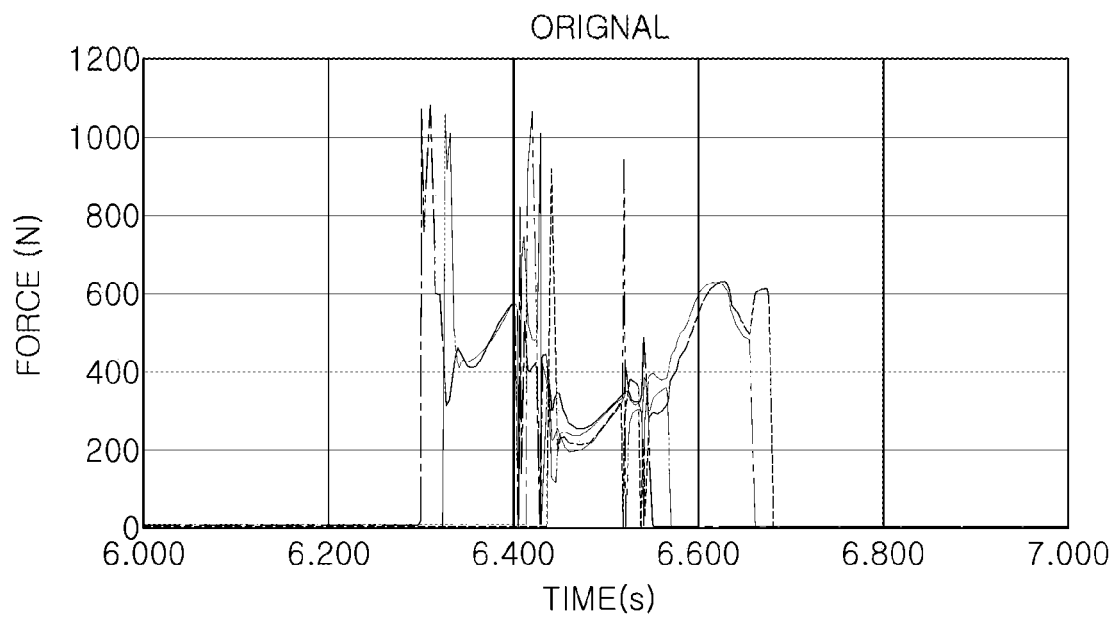
FIG. 12 is a graph illustrating impact force on a steering device and/or OHT coupled to the steering device at the time of the steering device for the OHT entering a guide rail branch in a straight line (v=3,300 mm/s) according to some example embodiments.
Figure 13:
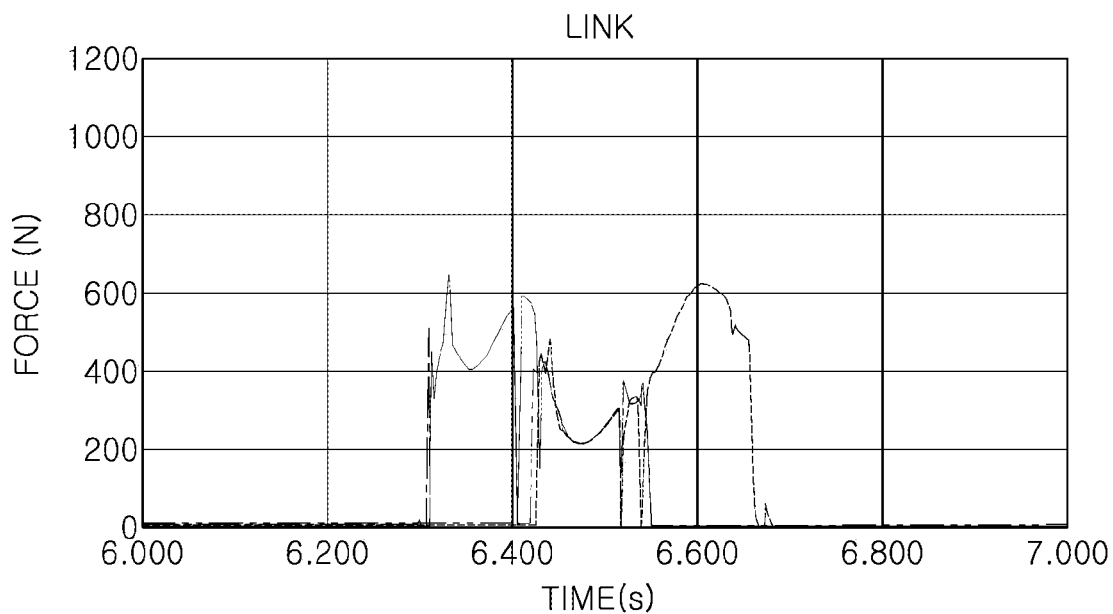
FIG. 13 is a graph illustrating impact force on a steering device and/or OHT coupled to the steering device at the time of the steering device for the OHT entering a guide rail branch in a straight line (v=3,300 mm/s) according to some example embodiments.
Figure 14:
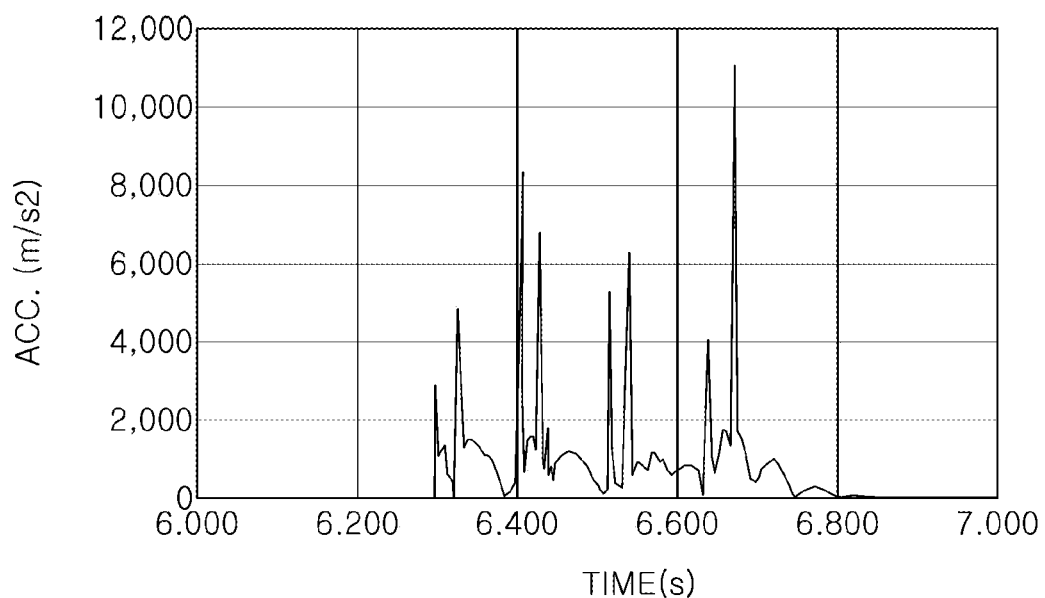
FIG. 14 is a graph illustrating an amount of vibrations of a steering device and/or OHT coupled to the steering device at the time of the steering device for the OHT entering a guide rail branch in a straight line (v=3,300 mm/s) according to some example embodiments.
Figure 15:
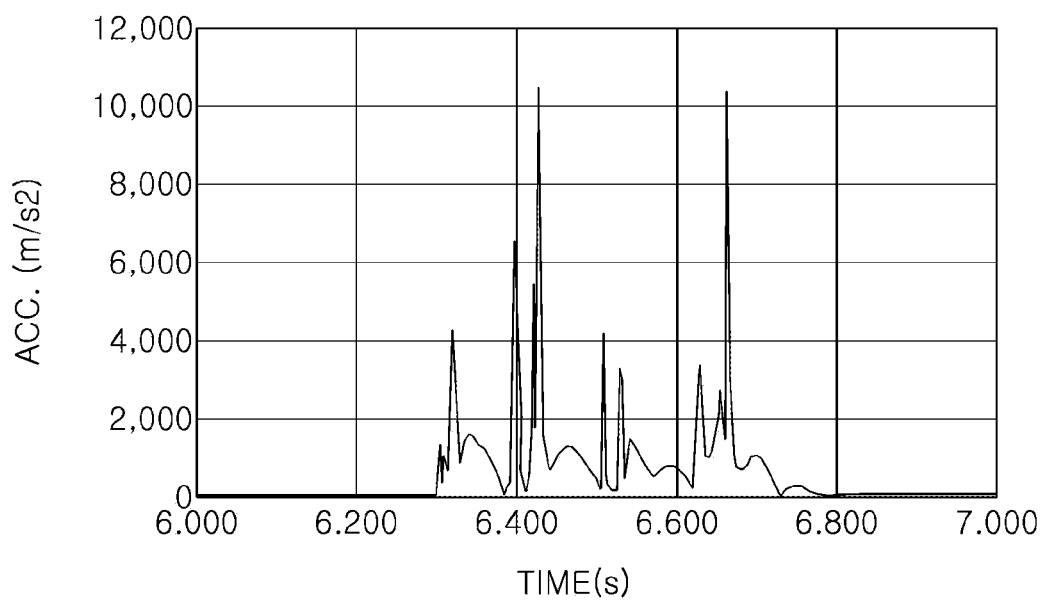
FIG. 15 is a graph illustrating an amount of vibrations of a steering device and/or OHT coupled to the steering device at the time of the steering device for the OHT entering a guide rail branch in a straight line (v=3,300 mm/s) according to some example embodiments.

FIG. 12 is a graph illustrating impact force on a steering device and/or OHT coupled to the steering device at the time of the steering device for the OHT entering a guide rail branch in a straight line (v=3,300 mm/s) according to some example embodiments wherein the steering device does not include a link that is tiltably installed on a steering plate of the steering device (e.g., may omit a link entirely or may include a link that is installed on a steering plate and is configured to not tilt, or rotate around a central axis of the link, in relation to the steering plate), FIG. 13 is a graph illustrating impact force on a steering device and/or OHT coupled to the steering device at the time of the steering device for the OHT entering a guide rail branch in a straight line (v=3,300 mm/s) according to some example embodiments wherein the steering device includes a link that is tiltably installed on a steering plate of the steering device, FIG. 14 is a graph illustrating an amount of vibrations of a steering device and/or OHT coupled to the steering device at the time of the steering device for the OHT entering a guide rail branch in a straight line (v=3,300 mm/s) according to some example embodiments wherein the steering device does not include a link that is tiltably installed on a steering plate of the steering device, and FIG. 15 is a graph illustrating an amount of vibrations of a steering device and/or OHT coupled to the steering device at the time of the steering device for the OHT entering a guide rail branch in a straight line (v=3,300 mm/s) according to some example embodiments wherein the steering device includes a link that is tiltably installed on a steering plate of the steering device.

Here, looking at a speed of a steering device entering a guide rail branch in a straight line, the branch region (e.g., guide rail branch) may be divided into two or more guide rails by branching the guide rail from one guide rail. An entry speed of the steering device when driving in a straight line along the existing guide rail rather than driving with the branching guide rail in this region is referred to as a speed of entering a branch in a straight line.

As shown in FIGS. 12 and 13, it can be seen that the impact force on a steering device and/or OHT coupled to the steering device at the time of the steering device for the OHT entering a guide rail branch in a straight line (v=3,300 mm/s) according to some example embodiments wherein the steering device includes a link that is tiltably installed on a steering plate of the steering device is reduced by 40% compared to a steering device that does not include a link that is tiltably installed on a steering plate of the steering device. That is, it can be seen that, in a steering device that does not include a link that is tiltably installed on a steering plate of the steering device, when a speed of entering a branch in a straight line is 3300 mm/s, the impact force transmitted to the steering device and/or OHT may be 1090 N, but in the steering device for an OHT according to some example embodiments wherein the steering device includes a link that is tiltably installed on a steering plate of the steering device, when the speed of entering a branch in a straight line is 3300 mm/s, the impact force transmitted to the steering device and/or OHT may be 648 N.

In addition, as shown in FIGS. 14 and 15, it can be seen that an amount of vibrations of a steering device and/or OHT coupled to the steering device at the time of the steering device for the OHT entering a guide rail branch in a straight line (v=3,300 mm/s) according to some example embodiments wherein the steering device includes a link that is tiltably installed on a steering plate of the steering device is reduced by 4.4% compared to a steering device that does not include a link that is tiltably installed on a steering plate of the steering device. That is, it can be seen that, in a steering device that does not include a link that is tiltably installed on a steering plate of the steering device, when the speed of entering a branch in a straight line is 3300 mm/s, the amount of vibrations transmitted to the steering device and/or OHT may be 1.14 g, but in the steering device for an OHT according to some example embodiments wherein the steering device includes a link that is tiltably installed on a steering plate of the steering device, when the speed of entering a branch in a straight line is 3300 mm/s, the amount of vibrations transmitted to the steering device and/or OHT may be 1.09 g.

As described above, it is possible to reduce the impact force and the amount of vibrations of to the steering device and/or OHT when driving in a straight line in the branch region of the guide rail according to some example embodiments wherein the steering device includes a link that is tiltably installed on a steering plate of the steering device.

As set forth above, according to the present inventive concepts, a steering device for an OHT configured to reduce or prevent damage to the guide rail and the steering device for an OHT may be provided.

In addition, a steering device for an OHT capable of reducing mechanical vibrations and impact transmitted to a wafer while the OHT is running may be provided.

The various and advantageous advantages and effects of the present inventive concepts are not limited to the above description, and can be more easily understood in the course of describing some example embodiments of the present inventive concepts.

While some example embodiments have been illustrated and described above, it will be apparent to those skilled in the art that modifications and variations could be made without departing from the scope of the present inventive concepts as defined by the appended claims.

What is claimed is:

1. A steering device for an OHT, the steering device comprising:
    a linear motion (LM) block;
    a steering plate fixedly installed to the LM block, the steering plate including one or more inner surfaces at least partially defining an insertion groove in the steering plate;
    a link tiltably installed in the insertion groove of the steering plate;
    a main bearing having an outer circumferential surface in contact with the link, the main bearing configured to reduce friction when the link is tilted in relation to the steering plate; and
    a guide roller rotatably installed on a protrusion protruding from the link.

2. The steering device of claim 1, wherein an interval between an outer side surface of the link and a side surface of the insertion groove is between about 1 mm and about 3 mm.

3. The steering device of claim 1, wherein the steering plate includes an installation protrusion that is in the insertion groove and on which the main bearing is installed.

4. The steering device of claim 1, wherein
    the link includes a plate-shaped body at least partially located within the insertion groove,
    the protrusion is protruding from an end portion of an upper surface of the plate-shaped body, and
    the plate-shaped body includes one or more inner surfaces defining a through-hole extending through the plate-shaped body in a central portion of the plate-shaped body, wherein the main bearing is configured to be inserted into the through-hole to be in contact with the link.

5. The steering device of claim 4, wherein the guide roller is rotatably installed on the protrusion through a bearing.

6. The steering device of claim 1, further comprising:
    a cover configured to cover an upper portion of the link.

7. The steering device of claim 1, further comprising a fixing member configured to fix the main bearing in place.

8. The steering device of claim 7, wherein the fixing member includes
    a first fixing member coupled to a lower portion of the main bearing, and
    a second fixing member coupled to the first fixing member and configured to prevent separation of the main bearing from the link.

9. The steering device of claim 8, wherein the second fixing member includes a protruding jaw configured to support an upper surface of the main bearing.

10. The steering device of claim 1, further comprising:
    a cover configured to cover an upper portion of the link.

11. A steering device for an OHT, the steering device comprising:
    a linear motion (LM) block;
    a steering plate fixedly installed on an upper surface of the LM block, the steering plate including one or more inner surfaces at least partially defining an insertion groove in an upper surface of the steering plate;
    a link that is at least partially within the insertion groove and is configured to be tilted in response to an external force being applied to the link;
    a main bearing between the steering plate and the link;
    a guide roller rotatably installed on an installation protrusion protruding from the link;
    a cover configured to cover the main bearing and the insertion groove of the steering plate; and
    a fixing member extending through the steering plate, the fixing member configured to fix the main bearing in place.

12. The steering device of claim 11, wherein an interval between an outer side surface of the link and a side surface of the insertion groove between about 1 mm and about 3 mm.

13. A steering device for an OHT, the steering device comprising:

a linear motion (LM) block;

a steering plate immovably installed to the LM block, the steering plate including one or more inner surfaces at least partially defining an insertion groove in the steering plate; and a link tiltably installed in the insertion groove of the steering plate such that the link is configured to rotate in relation to the steering plate around a central axis of the link at least partially within the insertion groove, wherein an interval between an outer side surface of the link and a side surface of the insertion groove is between about 1 mm and about 3 mm.

14. The steering device of claim 13, further comprising:

a main bearing having an outer circumferential surface in contact with the link, the main bearing configured to reduce friction when the link is tilted in relation to the steering plate; and a guide roller rotatably installed on a protrusion protruding from the link.

15. The steering device of claim 14, wherein the steering plate includes an installation protrusion that is in the insertion groove and on which the main bearing is installed.

16. The steering device of claim 14, wherein the link includes a plate-shaped body at least partially located within the insertion groove, the protrusion is protruding from an end portion of an upper surface of the plate-shaped body, and the plate-shaped body includes one or more inner surfaces defining a through-hole extending through the plate-shaped body in a central portion of the plate-shaped body, wherein the main bearing is configured to be inserted into the through-hole to be in contact with the link.

17. The steering device of claim 14, wherein the guide roller is rotatably installed on the protrusion through a bearing.

18. The steering device of claim 14, further comprising a fixing member configured to fix the main bearing in place.

19. The steering device of claim 18, wherein the fixing member includes a first fixing member coupled to a lower portion of the main bearing, and a second fixing member coupled to the first fixing member and configured to prevent separation of the main bearing from the link.

20. The steering device of claim 19, wherein the second fixing member includes a protruding jaw configured to support an upper surface of the main bearing.

* * * * *